United States Patent
Rosas et al.

(10) Patent No.: US 11,175,311 B1
(45) Date of Patent: Nov. 16, 2021

(54) HIGH-FREQUENCY LAYERED TESTING PROBE

(71) Applicant: Signal Microwave, LLC, Chandler, AZ (US)

(72) Inventors: William Rosas, Chandler, AZ (US); Eric Gebhard, Scottsdale, AZ (US); Peter Frank, Carp (CA)

(73) Assignee: SIGNAL MICROWAVE, LLC, Chandler, AZ (US)

( * ) Notice: Subject to any disclaimer, the term of this patent is extended or adjusted under 35 U.S.C. 154(b) by 103 days.

(21) Appl. No.: 16/775,185

(22) Filed: Jan. 28, 2020

Related U.S. Application Data

(60) Provisional application No. 62/798,046, filed on Jan. 29, 2019.

(51) Int. Cl.
*G01R 1/067* (2006.01)
*G01R 1/073* (2006.01)

(52) U.S. Cl.
CPC ..... *G01R 1/06772* (2013.01); *G01R 1/06738* (2013.01); *G01R 1/06788* (2013.01); *G01R 1/07342* (2013.01)

(58) Field of Classification Search
CPC ............ G01R 1/06722; G01R 1/06738; G01R 1/06788; G01R 1/07342
See application file for complete search history.

(56) References Cited

U.S. PATENT DOCUMENTS

| | | | | |
|---|---|---|---|---|
| 5,561,378 A | * | 10/1996 | Bockelman | G01R 1/06772 324/754.07 |
| 7,498,829 B2 | * | 3/2009 | Gleason | G01R 1/06772 324/750.26 |
| 7,876,114 B2 | * | 1/2011 | Campbell | G01R 1/06772 324/754.06 |
| 10,852,322 B1 | * | 12/2020 | Rosas | G01R 1/07392 |
| 2003/0095014 A1 | * | 5/2003 | Lao | H01L 23/66 333/33 |
| 2005/0237078 A1 | * | 10/2005 | Cannon | G01R 1/06788 324/754.02 |
| 2005/0264313 A1 | * | 12/2005 | Aoyagi | G01R 1/06772 324/755.02 |
| 2006/0061348 A1 | * | 3/2006 | Cannon | G01R 1/06788 324/72.5 |

(Continued)

*Primary Examiner* — Paresh Patel
(74) *Attorney, Agent, or Firm* — Booth Udall Fuller, PLC

(57) ABSTRACT

A high-frequency testing probe is disclosed. The probe includes a layered probe substrate having a first and second PCB, as well as first and second conducting traces disposed on opposite sides of the substrate. The probe substrate has an ungrounded differential region including two probe tips coupled to the traces, a grounded differential region, and a decoupled differential region including two probe connectors coupled to the traces. The probe also includes a ground plane between the two PCBs and between the two traces in the decoupled and grounded differential regions. In the ungrounded differential region, the first and second traces form a first differential transmission pair having a differential impedance. In the grounded differential region, the first and second traces form a second differential transmission pair having the differential impedance. The probe connectors are configured to couple to one of a vector network analyzer and a time domain reflectometer.

20 Claims, 7 Drawing Sheets

(56) References Cited

U.S. PATENT DOCUMENTS

| | | | |
|---|---|---|---|
| 2007/0153490 A1* | 7/2007 | Benham | G01R 1/06772 361/777 |
| 2007/0222468 A1* | 9/2007 | McTigue | G01R 1/06772 324/755.07 |
| 2012/0274347 A1* | 11/2012 | Wang | G01R 31/2889 324/755.02 |

* cited by examiner

HIGH-FREQUENCY LAYERED TESTING PROBE

RELATED APPLICATIONS

This application claims the benefit of U.S. provisional patent application 62/798,046, filed Jan. 29, 2019 titled "High Frequency Layered Testing Probe," the entirety of the disclosure of which is hereby incorporated by this reference.

TECHNICAL FIELD

Aspects of this document relate generally to high frequency testing probes.

BACKGROUND

With the increasing bandwidth demands of internet connectivity, cloud computing, and wireless communications, the demand for extremely high frequency radio data transmission continues to grow. In addition to radio frequency transmissions through antennas, transmission of data on a circuit board from one chip to another and over a cable or backplane from one device to another, as well as transmission through fiber optics also involves and benefits from extremely high frequency data transmission.

Such extremely high frequency data transmission requires components, including semiconductor devices, capable of processing these high frequency data signals. During development of these high-frequency components it is generally necessary for researchers to test the functionality of the component under design over its intended frequency range. Once developed, it is also desirable to test manufactured components to verify frequency response and other functionality in accordance with specified tolerances. In both cases, the testing of the component is typically accomplished through the use of testing probes connected to a vector network analyzer (VNA), time domain reflectometer (TDR), oscilloscope, spectrum analyzer, bit error rate tester (BERT) or other measurement equipment.

Conventional testing probes typically include two or more electrodes which are placed on conducting contact points on the surface of the component being tested. The electrodes are attached to a single cable composed of multiple conductive wires for transmitting electrical signals to and from connected measurement equipment. Such cable testing probes have been used to reliably test signal frequencies of up to 25 GHz.

Working within the extremely high frequency regime has its own set of difficulties. Testing equipment, particularly testing probes that interface the test equipment with the device been evaluated, are particularly sensitive to deviations from an often tight set of tolerances. High frequency testing probes can be expensive and slow to develop and manufacture with consistent, reliable performance at high frequencies. Furthermore, as frequencies increase, addressing the problem of loss in testing probes becomes more difficult.

Additionally, attaching the electrodes to the conductive wires within a cable, as is done in conventional testing probes, constrains the arrangement of the electrodes to a limited choice of geometries. Expanding beyond these constraints in conventional cable-based testing probes often introduces reflections and degrades the performance of the probe.

SUMMARY

According to one aspect, a high-frequency testing probe includes a probe substrate that is layered. The probe substrate includes a first printed circuit board (PCB) having a first surface and a second surface opposite the first surface, and a second PCB having a third surface and a fourth surface opposite the third surface, the third surface being affixed to the second surface of the first PCB. The probe substrate also includes a first conducting trace disposed upon the first surface of the first PCB, and a second conducting trace disposed upon the fourth surface of the second PCB, as well as an ungrounded differential region. Inside the ungrounded differential region the first conducting trace is separated from the second conducting trace by a first distance. The first conducting trace is coupled to the second conducting trace through the first and second PCBs forming a first differential transmission pair having a target differential impedance within the ungrounded differential region. The first conducting trace and the second conducting trace are overlapping throughout the ungrounded differential region, and the first and second conducting traces have a first width in the ungrounded differential region.

The probe substrate also includes a decoupled region distal to the ungrounded differential region and includes a plurality of probe connectors disposed upon the probe substrate. The plurality of probe connectors includes a first probe connector coupled to the first conducting trace and a second probe connector coupled to the second conducting trace. Inside the decoupled region the first conducting trace is separated from the second conducting trace by at least a third distance. The first and second conducting traces have a third width in the decoupled region. The probe substrate further includes a grounded differential region including the probe substrate between the decoupled region and the ungrounded differential region. Inside the grounded differential region the first conducting trace is separated from the second conducting trace on average by a second distance. The first conducting trace is coupled to the second conducting trace through the first and second PCBs forming a second differential transmission pair having the target differential impedance within the grounded differential region. The first and second conducting traces have a second width in the grounded differential region. Furthermore, the probe substrate includes a ground plane that is conductive and sandwiched between the first PCB and the second PCB, between the first and second conducting traces and existing only in the decoupled region and the grounded differential region. The high-frequency testing probe also includes at least two probe tips directly coupled to and extending outward from the ungrounded differential region of the probe substrate, each probe tip having a first end and a second end. The at least two probe tips include a first probe tip communicatively coupled to the first probe connector through the first conducting trace disposed upon the first surface of the first PCB. The first conducting trace is electrically isolated and communicatively couples the first probe tip only to the first probe connector. The first probe tip is coupled to the first PCB at a first angle with respect to the first surface of the first PCB between 10° and 90°. The at least two probe tips also includes a second probe tip communicatively coupled to the second probe connector through the second conducting trace disposed upon the fourth surface of the second PCB. The second conducting trace is electrically isolated and communicatively couples the second probe tip only to the second probe connector. The second probe tip is coupled to the second PCB at a second angle with respect to the fourth surface of the second PCB between 10° and 90°. The first, second, and third distances are all different. The plurality of probe connectors are configured to couple the high-frequency testing probe to at least one of a high-frequency vector network analyzer and a high-frequency time domain reflectometer.

Particular embodiments may comprise one or more of the following features. The first conducting trace and the second conducting trace may each have a third width in the decoupled region, a second width in the grounded differential region, and/or a first width in the ungrounded differential region. The first width may be greater than the second width and/or less than the third width. The first probe tip may be coupled to the first PCB at a third angle with respect to the second probe tip between 0° and 90°. The at least two probe tips may include at least three probe tips. Both the first PCB and the second PCB may comprise polytetrafluoroethylene (PTFE).

According to another aspect of the disclosure, a high-frequency testing probe includes a probe substrate that is layered and includes a first printed circuit board (PCB) having a first surface and a second surface opposite the first surface, and a second PCB having a third surface and a fourth surface opposite the third surface. The third surface is affixed to the second surface of the first PCB. The probe substrate also includes a first conducting trace disposed upon the first surface of the first PCB, and a second conducting trace disposed upon the fourth surface of the second PCB, as well as an ungrounded differential region. Inside the ungrounded differential region the first conducting trace is separated from the second conducting trace by a first distance. The first conducting trace is coupled to the second conducting trace through the first and second PCBs forming a first differential transmission pair having a target differential impedance within the ungrounded differential region. The first and second conducting traces have a first width in the ungrounded differential region. The probe substrate also includes a decoupled region distal to the ungrounded differential region and having a plurality of probe connectors disposed upon the probe substrate. The plurality of probe connectors includes a first probe connector coupled to the first conducting trace and a second probe connector coupled to the second conducting trace. Inside the decoupled region the first conducting trace is separated from the second conducting trace by at least a third distance. The first and second conducting traces have a third width in the decoupled region. The probe substrate further includes a grounded differential region including the probe substrate between the decoupled region and the ungrounded differential region. Inside the grounded differential region the first conducting trace is separated from the second conducting trace on average by a second distance, and the first conducting trace is coupled to the second conducting trace through the first and second PCBs forming a second differential transmission pair having the target differential impedance within the grounded differential region. The first and second conducting traces have a second width in the grounded differential region. Finally, the probe substrate includes a ground plane that is conductive and sandwiched between the first PCB and the second PCB, between the first and second conducting traces and existing only in the decoupled region and the grounded differential region. The high-frequency testing probe also includes at least two probe tips directly coupled to and extending outward from the ungrounded differential region of the probe substrate, each probe tip having a first end and a second end. The at least two probe tips includes a first probe tip communicatively coupled to the first probe connector through the first conducting trace disposed upon the first surface of the first PCB. The first conducting trace is electrically isolated and communicatively couples the first probe tip only to the first probe connector. The at least two probe tips also includes a second probe tip communicatively coupled to the second probe connector through the second conducting trace disposed upon the fourth surface of the second PCB, the second conducting trace being electrically isolated and communicatively coupling the second probe tip only to the second probe connector. The plurality of probe connectors are configured to couple the high-frequency testing probe to at least one of a high-frequency vector network analyzer and a high-frequency time domain reflectometer.

Particular embodiments may comprise one or more of the following features. The first width may be greater than the second width and/or less than the third width. The third distance may be greater than the second distance, and the second distance may be greater than the first distance. The first conducting trace and the second conducting trace may overlap throughout the ungrounded differential region. The first probe tip may be coupled to the first PCB at a first angle with respect to the first surface of the first PCB between 10° and 90°, and the second probe tip may be coupled to the second PCB at a second angle with respect to the fourth surface of the second PCB between 10° and 90°.

According to yet another aspect of the disclosure, a high-frequency testing probe includes a probe substrate that is layered. The probe substrate includes a first printed circuit board (PCB) having a first surface and a second surface opposite the first surface, and a second PCB having a third surface and a fourth surface opposite the third surface, the third surface being affixed to the second surface of the first PCB. The probe substrate includes a first conducting trace disposed upon the first surface of the first PCB, a second conducting trace disposed upon the fourth surface of the second PCB, and an ungrounded differential region. Inside the ungrounded differential region the first conducting trace is separated from the second conducting trace by a first distance, the first conducting trace coupled to the second conducting trace through the first and second PCBs forming a first differential transmission pair having a target differential impedance within the ungrounded differential region. The probe substrate also includes a decoupled region distal to the ungrounded differential region and comprising a plurality of probe connectors disposed upon the probe substrate. The plurality of probe connectors includes a first probe connector coupled to the first conducting trace and a second probe connector coupled to the second conducting trace. Inside the decoupled region the first conducting trace is separated from the second conducting trace by at least a third distance. The probe substrate includes a grounded differential region made up of the probe substrate between the decoupled region and the ungrounded differential region. Inside the grounded differential region the first conducting trace is separated from the second conducting trace on average by a second distance, the first conducting trace coupled to the second conducting trace through the first and second PCBs forming a second differential transmission pair having the target differential impedance within the grounded differential region. The probe substrate includes a ground plane that is conductive and sandwiched between the first PCB and the second PCB, between the first and second conducting traces and existing only in the decoupled region and the grounded differential region. The plurality of probe connectors are configured to couple the high-frequency testing probe to at least one of a high-frequency vector network analyzer and a high-frequency time domain reflectometer.

Particular embodiments may comprise one or more of the following features. The high-frequency testing probe may further include at least two probe tips directly coupled to and extending outward from the ungrounded differential region of the probe substrate. Each probe tip may have a first end and a second end. The at least two probe tips may include a first probe tip communicatively coupled to the first probe connector through the first conducting trace disposed upon the first surface of the first PCB, the first conducting trace being electrically isolated and communicatively coupling the first probe tip only to the first probe connector, and/or a second probe tip communicatively coupled to the second probe connector through the second conducting trace disposed upon the fourth surface of the second PCB, the second conducting trace being electrically isolated and communicatively coupling the second probe tip only to the second probe connector. The first probe tip may be coupled to the first PCB at a first angle with respect to the first surface of the first PCB between 10° and 90°. The first conducting trace and the second conducting trace may each be a third width in the decoupled region, a second width in the grounded differential region, and/or a first width in the ungrounded differential region. The first, second, and/or third widths may all be different. The third distance may be greater than the second distance, and the second distance may be greater than the first distance. The first conducting trace and the second conducting trace may overlap throughout the ungrounded differential region.

Aspects and applications of the disclosure presented here are described below in the drawings and detailed description. Unless specifically noted, it is intended that the words and phrases in the specification and the claims be given their plain, ordinary, and accustomed meaning to those of ordinary skill in the applicable arts. The inventors are fully aware that they can be their own lexicographers if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . ." or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

The disclosure will hereinafter be described in conjunction with the appended drawings, where like designations denote like elements, and.

DETAILED DESCRIPTION

Figure 1:
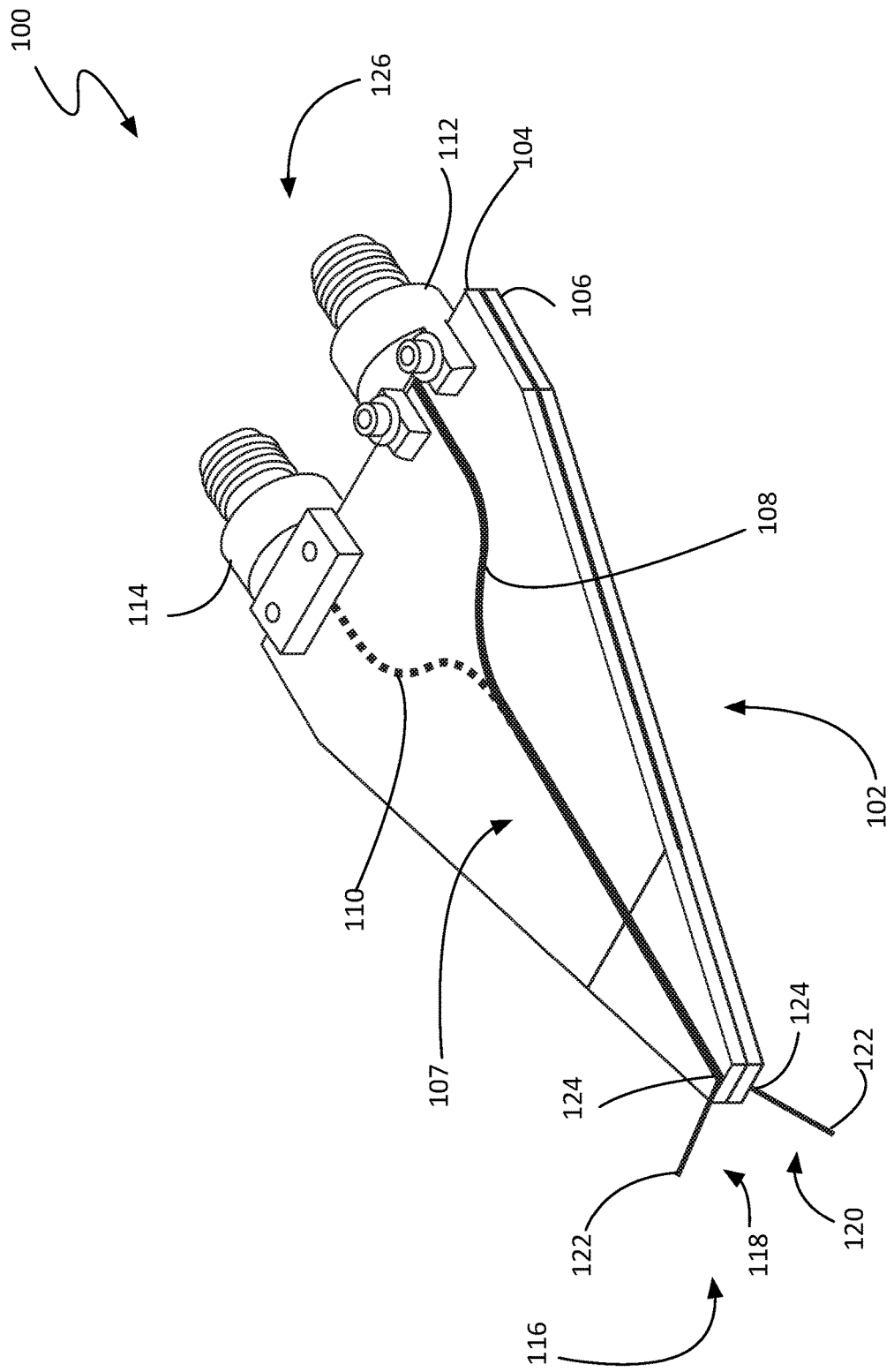
FIG. 1 is a perspective view of a high frequency layered testing probe.

This disclosure, its aspects and implementations, are not limited to the specific material types, components, methods, or other examples disclosed herein. Many additional material types, components, methods, and procedures known in the art are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

While this disclosure includes a number of embodiments in many different forms, there is shown in the drawings and will herein be described in detail particular embodiments with the understanding that the present disclosure is to be considered as an exemplification of the principles of the disclosed methods and systems, and is not intended to limit the broad aspect of the disclosed concepts to the embodiments illustrated.

With the increasing bandwidth demands of internet connectivity, cloud computing, and wireless communications, the demand for extremely high frequency radio data transmission continues to grow. In addition to radio frequency transmissions through antennas, transmission of data on a circuit board from one chip to another and over a cable or backplane from one device to another, as well as transmission through fiber optics also involves and benefits from extremely high frequency data transmission.

Such extremely high frequency data transmission requires components, including semiconductor devices, capable of processing these high frequency data signals. During development of these high-frequency components it is generally necessary for researchers to test the functionality of the component under design over its intended frequency range. Once developed, it is also desirable to test manufactured components to verify frequency response and other functionality in accordance with specified tolerances. In both cases, the testing of the component is typically accomplished through the use of testing probes connected to a vector network analyzer (VNA), time domain reflectometer (TDR), oscilloscope, spectrum analyzer, bit error rate tester (BERT) or other measurement equipment.

Conventional testing probes typically include two or more electrodes which are placed on conducting contact points on the surface of the component being tested. The electrodes are attached to a single cable composed of multiple conductive wires for transmitting electrical signals to and from connected measurement equipment. Such cable testing probes have been used to reliably test signal frequencies of up to 25 GHz.

Working within the extremely high frequency regime has its own set of difficulties. Testing equipment, particularly testing probes that interface the test equipment with the device been evaluated, are particularly sensitive to deviations from an often tight set of tolerances. High frequency testing probes can be expensive and slow to develop and manufacture with consistent, reliable performance at high frequencies. Furthermore, as frequencies increase, addressing the problem of loss in testing probes becomes more difficult.

Additionally, attaching the electrodes to the conductive wires within a cable, as is done in conventional testing probes, constrains the arrangement of the electrodes to a limited choice of geometries. Expanding beyond these constraints in conventional cable-based testing probes often introduces reflections and degrades the performance of the probe.

Contemplated herein is a high-frequency layered testing probe making use of one or more printed circuit board (PCB) layers to join probe tips to connectors linked to test equipment. This deviation from the conventional method of using wire or cable as the transmission line joining the probe tips to the connectors provides a number of advantages, including a significantly improved range of frequencies that can be reliably reproduced. Some embodiments have consistently shown operating ranges as high as 40-70 GHz, with others venturing even higher.

Furthermore, the testing probes contemplated herein are adaptable to a wider range of electrode configurations than conventional probes, without the typical performance trade-offs. The use of layers of PCB permits electrode geometries and electrical attributes that are not practical when implemented in conventional testing probes. These new testing probes are also easier to manufacture and customize than conventional probes. Rather than having to setup and extrude a new batch of cable to tune a probe redesign (e.g. hitting a target impedance, etc.), a layers of PCB can be quickly fabricated, tested, and refined. PCB fabrication can be done with a degree of precision well beyond conventional methods, and at lower cost.

While the descriptor "new" is used above to differentiate the new high-frequency testing probe from "conventional" cable testing probes, for convenience and ease of description, subsequent references will refer to the new high-frequency testing probe simply as the "layered testing probe" "testing probe" or "probe" as distinguished from "conventional" testing probes. For additional convenience and ease of description, a number of relative positional descriptors, such as "left," "right," "front," "rear," "top," and "bottom" are used by way of illustration and not by way of limitation.

FIG. 1 is a perspective view of a non-limiting example of a high frequency layered testing probe 100. As shown, the testing probe 100 comprises a plurality of probe connectors 126 and a plurality of probe tips 116, the tips and connectors communicatively coupled through a plurality of conducting traces 107, all coupled to a layered probe substrate 102.

While much of the discussion regarding various embodiments of the contemplated testing probes 100 will be done with respect to probes 100 having two probe tips (i.e. first probe tip 118 and second probe tip 120), as well as two conducting traces (i.e. first conducting trace 108 and second conducting trace 110), two probe connectors (i.e. first probe connector 112 and second probe connector 114), and two substrate layers (i.e. first printed circuit board (PCB) 104 and second PCB 106), it should be understood that other embodiments may make use of three, four, or more probe tips 116 and accompanying structure, and/or one, three, four, or more substrate layers. In no way should the use of exemplary embodiments with two probe tips 116 be construed as limiting the number of probe tips 116 in other embodiments. In some embodiments, the testing probe 100 operates as a data differential probe.

As shown, the non-limiting example of a new testing probe 100 shown in FIG. 1 has a layered probe substrate 102 comprising a first PCB 104 and a second PCB 106 which are affixed to each other. The probe substrate 102 provides a platform to which the other components are attached. As will be discussed in greater detail, below, the surfaces of these two PCB layers provide three tiers on which components of the probe 100 may be disposed. Thus, embodiments comprising a single PCB layer can still be layered probes, using both surfaces (e.g. conducting traces on the top surface and a ground plane on the bottom surface, etc.). As mentioned above, the use of printed circuit boards as layers in the probe substrate 102 provides both performance and manufacturing advantages.

According to various embodiments, the testing probe 100 comprises a plurality of probe tips 116 (i.e. first probe tip 118 and second probe tip 120). In the context of the present description and the claims that follow, a probe tip is the conductive portion that makes contact with the device or circuit being tested, ultimately forming a connection to test equipment. As shown, the probe tips 116 each have a first end 122 that is put in contact with the testing subject, and a second end 124 distal to the first end and coupled to a conducting trace 107.

According to various embodiments, each probe tip 116 is coupled to, and in electronic communication with, a unique probe connector 126, through a unique conducting trace 107 disposed on the printed circuit board. In some embodiments, the probe tip 116 may be soldered to its conducting trace (e.g. soldered to a solder pad integral with the trace, etc.). As an option, the probe tips 116 may be coupled to the probe substrate 102 through couplings that may allow for the orientation and/or extension of the tips to be adjusted. Such adjustability allows the probe to be configured to interface with a device being tested that may have an irregular shape or surface.

According to various embodiments, the probe tips 116 may be composed of a variety of conducting materials including, but not limited to, gold, copper, aluminum, alloys (e.g. alloys containing gold, copper, aluminum, brass, steel, etc.), other alloys such as tellurium copper, and the like. In one specific embodiment, the probe tips 116 comprise beryllium copper, for durability. As an option, the beryllium copper may be heat-treated.

In some embodiments, the probe tips 116 may be of uniform and consistent composition throughout. In other embodiments, the probe tips 116 may be plated. For example, in some embodiments, the probe tips 116 may be plated using nickel, tin, zinc, or any other plating material known in the art.

In some embodiments, the probe tips 116 may be cylindrical in shape, while in others they may be flat. In still other embodiments, the probe tips 116 may have any other shape known in the art for electrodes or probes. As a specific example, in one embodiment, the probe tips 116 are cylindrical, having a diameter of 30 mils, and are at least 250 mils in length. Other embodiments may make use of probe tips 116 having larger or smaller diameters, depending, at least in part, upon material strength and intended use environment.

In some embodiments, the orientation and/or relative position of a probe tip 116 may be adjustable. This adjustability may accomplished using one or more adjustable couplings, which in some embodiments are also conductive. Probe tip orientations and adjustability will be discussed further with respect to FIGS. 2 and 3, below.

Each probe tip 116 is coupled to, and in electronic communication with, a unique conducting trace 107 disposed on one of the printed circuit boards 104, 106. In some embodiments, the probe tip 116, or more specifically the second end 124 of a probe tip 116, may be soldered to its conducting trace 107 (e.g. soldered to a solder pad integral with the trace 114, etc.).

In contrast to conventional testing probes, the testing probes 000110 contemplated herein make use of conducting traces 107 disposed on a surface of a PCB as transmission lines connecting the probe tips 116 to the probe connectors 112. Each probe tip 116 has its own, isolated conducting trace 107. For example, as shown in FIG. 1, the first probe tip 118 is coupled to the first conducting trace 108 that is also coupled to the first probe connector 112, and nothing else.

Each conducting trace 107 is electrically isolated from the other elements of the probe 100, except for a single probe tip 116 and a single probe connector 126, according to various embodiments. It should be noted that, in the context of the present description and the claims that follow, "electrically isolated" means a limitation on direct connections (e.g. a trace 107 does not connect to more than one tip 116, etc.), and should not be construed to mean a complete absence of all electrical interaction with other elements, which is often unavoidable.

As shown, the first conducting trace 108 is disposed upon the first surface of the first PCB 104 (see first surface 300 of FIG. 3), which could be called the top surface of the probe substrate 102. Furthermore, the second conducting trace 110 is disposed upon the fourth surface of the second PCB 106 (see the fourth surface 306 of FIG. 3), which in turn could be called the bottom surface of the probe substrate 102. The conducting traces 107 may be disposed on the printed circuit boards 104, 106 of the probe substrate 102 using any method known in the art.

The conductive traces 107 have their own frequency limitation that is a direct consequence of their size, shape, relative position, and probe geometry. Advantageous over conventional testing probes making use of cables, conductive traces 107 can be disposed on a PCB substrate with high accuracy, allowing for the parameters that dictate this frequency limitation to be modified with precision. Furthermore, the use of PCBs and conductive traces provides precision and accuracy that is easy to consistently reproduce in manufacturing.

As shown, each conducting trace 107 leads to one of a plurality of probe connectors 126 (e.g. first probe connector 112, second probe connector 114). In the context of the present description and the claims that follow, a probe connector 112 is a terminal configured to couple with a high-frequency cable or other conduit known in the art, to couple with a receiving port or terminal on a testing device. It should be noted that while FIG. 1 and other figures show threaded probe connectors 126, a variety of connection terminals types are encompassed within this disclosure. The probe connectors 126 are disposed upon the probe substrate 102.

The use of multiple tiers of PCB may also allow flexibility in the geometry of other portions of the layered testing probe 100. For example, probe connectors 126 that facilitate the coupling of the testing probe to a measurement device can been connected to different sides, or the same side. As shown, the first probe connector 112 is communicatively coupled to the first probe tip 118 through the first conducting trace 108 on the top of the probe substrate 102, and the second probe connector 114 is communicatively coupled to the second probe tip 120 through the second conducting trace 110 on the bottom of the probe substrate 102.

Figure 2:
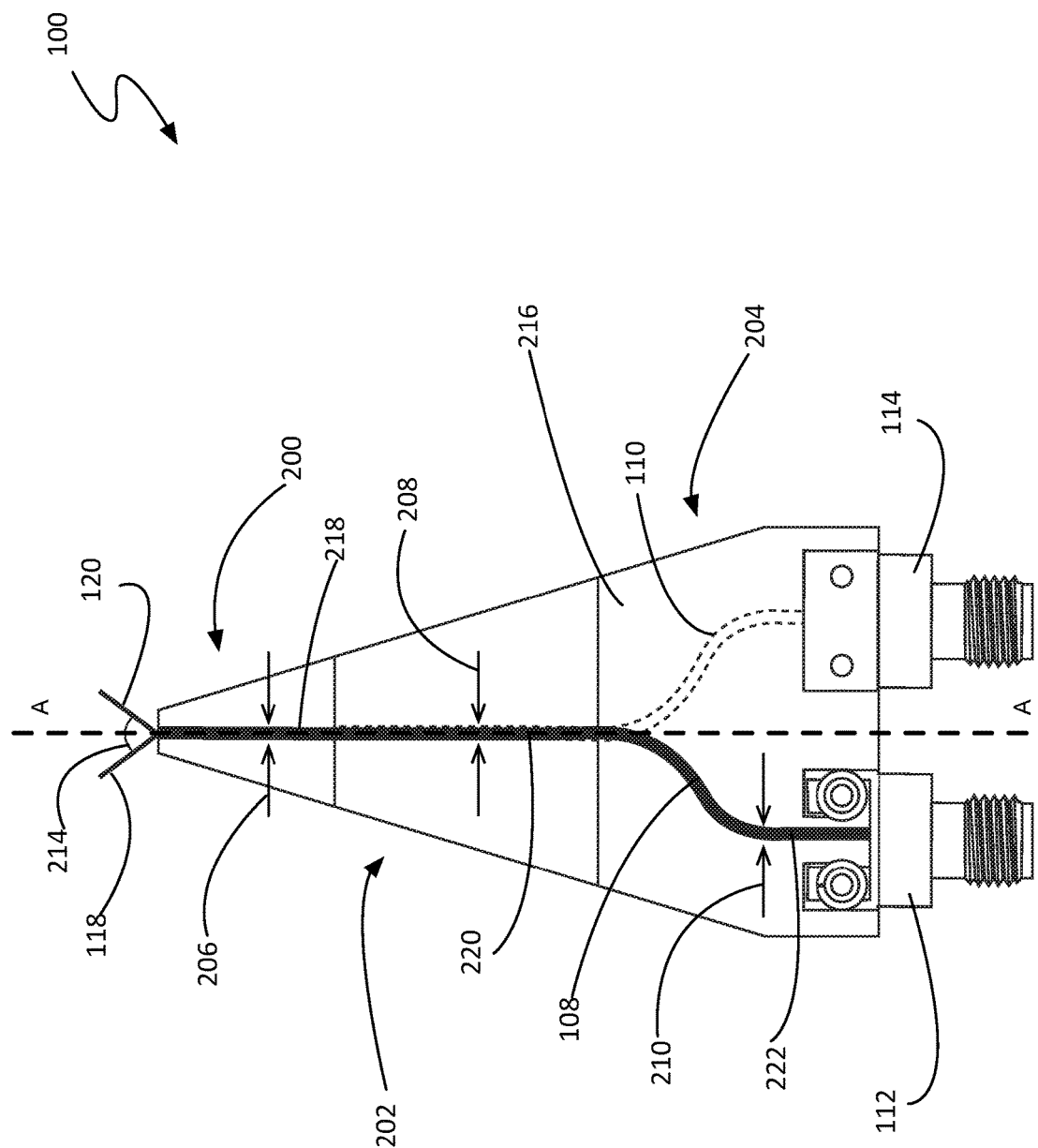
FIG. 2 is a top view of a high frequency layered testing probe.

FIG. 2 is a top view of a non-limiting example of a high frequency layered testing probe. It should be noted that the second conducting trace 110 is depicted with dashed lines; it would otherwise be hidden from view, being on the bottom surface of the probe substrate 102.

As shown, the probe substrate 102 may be partitioned into three regions, an ungrounded differential region 200, a grounded differential region 202, and a decoupled region 204. Within the ungrounded differential region 200, the first conducting trace 108 and the second conducting trace 110 are separated from each other by the first PCB 104 and the second PCB 106, but there is no ground plane 216 between them. According to various embodiments, the first conducting trace 108 and the second conducting trace 110 are separated from each other by a distance small enough that their fields couple, forming a first differential transmission pair 218. At one end of the first differential transmission pair 218 are the two probe tips 116; according to various embodiments, the probe tips 116 are coupled to the traces within the ungrounded differential region 200.

At the opposite end of the probe substrate 102 is the decoupled region 204. Within the decoupled region 204 the first conducting trace 108 is coupled to the first probe connector 112 and the second conducting trace 110 is coupled to the second probe connector 114, as shown. Within the decoupled region 204, the conducting traces move apart from each other, such that when they reach the probe connectors 126, they are behaving like single ended lines 222, no longer coupled to each other enough to function as a differential transmission pair. At the connector boundary of the decoupled region 204, the traces are acting like isolated single ended lines. At the edge of the decoupled region 204 that meets with the grounded differential region 202, the traces are just about to couple and form a differential transmission pair. According to various embodiments, the decoupled region 204 is a transition region between these two extremes. Although it is referred to as the decoupled region 204, that name is not meant to imply a complete decoupling between the traces throughout the entire region.

According to various embodiments, the remaining portion of the probe substrate 102 between the decoupled region 204 and the ungrounded differential region 200 is the grounded differential region 202. The grounded differential region 202 is similar to the ungrounded differential region 200 in that the conducting traces 107 are close enough to each other that their fields interact and they form a differential transmission pair (i.e. the second differential transmission pair 220). However, unlike the ungrounded differential region 200, the grounded differential region 202 has a ground plane 216 between the two conducting traces 107.

The testing probe 100 has a ground plane 216 sandwiched between the first PCB 104 and the second PCB 106, but it only exists in the decoupled region 204 and the grounded differential region 202. Throughout those two regions, the conducting traces 107 are separated by the ground plane 216. The ground plane 216 ends at the boundary of the ungrounded differential region 200.

While the electrical properties of these regions are different, it should be noted that the conducting traces 107 are continuous as they pass through the region boundaries. However, their geometries may change. For example, as shown, the conducting traces 107 may have a first width 206 in the ungrounded differential region 200, a second width 208 in the grounded differential region 202, and a third width 210 in the decoupled region 204. These widths may be modified to ensure that the differential transmission pairs in the grounded and ungrounded differential regions have the same target differential impedance 212, and that the traces 107 in the decoupled region 204 have a desired single ended line impedance.

In some embodiments, all three widths may be different. In other embodiments, two or more widths may be the same. In one embodiment, the first width 206 is greater than the second width 208 and less than the third width 210. Another advantage of using conducting traces disposed on PCB surfaces to form transmission lines is the precision with which the width and geometry of the traces can be modified. Because these traces 107 can be sized and placed with a great degree of precision, these new layered testing probes 100 can be made to have specific impedances much easier than conventional probes.

As shown, in some embodiments, the conducting traces 107 may completely overlap in the ungrounded differential region 200. In the grounded differential region 202, in some embodiments, the traces 107 may completely overlap for the majority of the region 202. In other embodiments, the traces 107 may only partially overlap for a majority of the region 202 (e.g. to obtain a target differential impedance in that region 202, etc.).

In some embodiments, the probe tips 116 may be oriented such that they are at an angle with respect to each other. As shown, the probe tips 116 are oriented such that the first probe tip 118 and second probe tip 120 are at an angle (e.g. third angle 214) with respect to each other. The third angle 214 may range from 0° to 90°, according to various embodiments. In other embodiments, the probe tips 116 may be aligned with each other.

Figure 3:
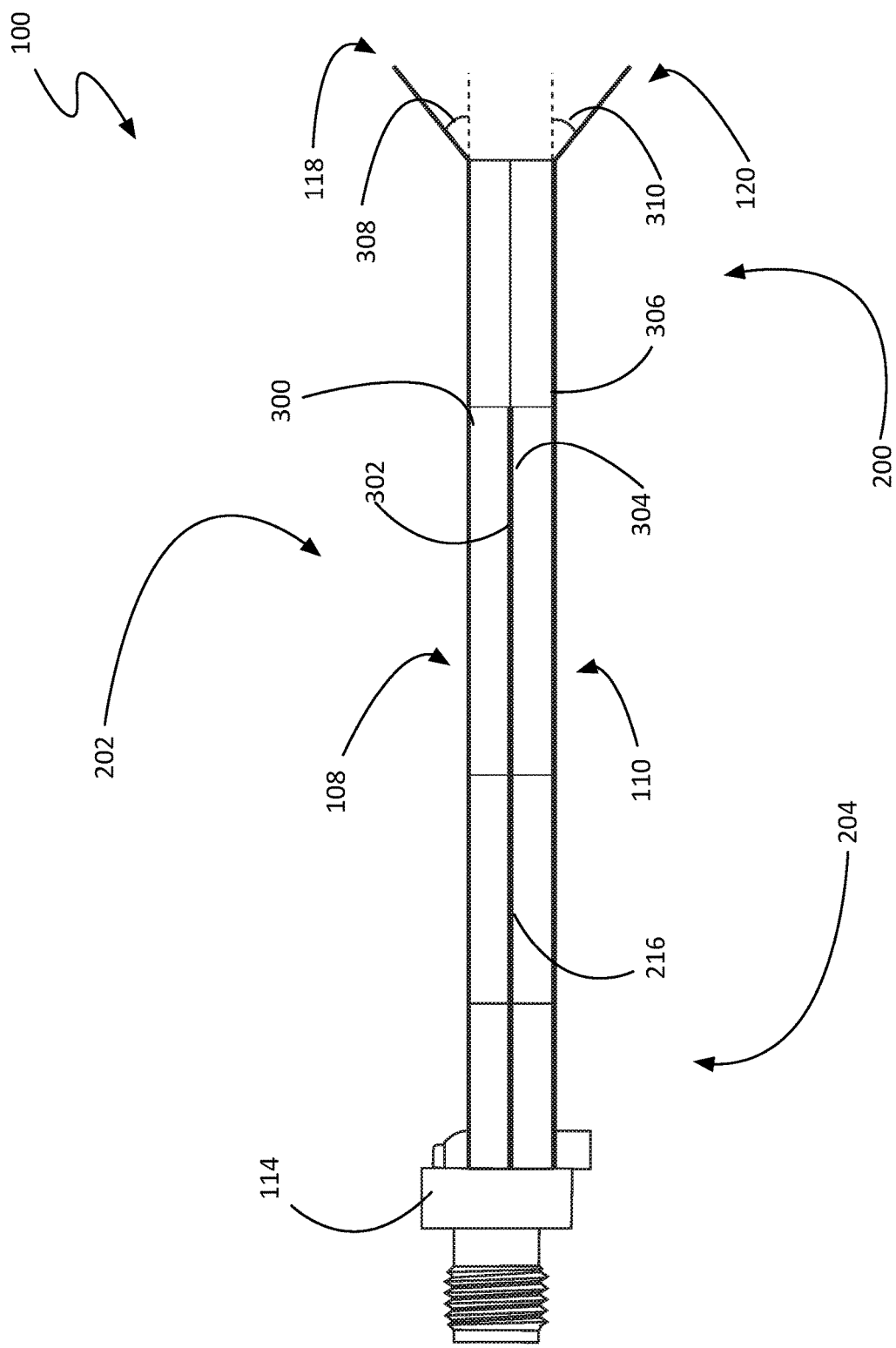
FIG. 3 is a side view of a high frequency layered testing probe.

FIG. 3 is a side view of a non-limiting example of a high frequency layered testing probe. As shown the probe substrate 102 comprises a first PCB 104 and a second PCB 106. The first PCB 104 has a first surface 300 and a second surface 302 opposite the first surface 300. The second PCB 106 has a third surface 304 and a fourth surface 306 opposite the third surface 304. As shown, the first conducting trace 108 is disposed on the first surface 300 and the second conducting trace 110 is disposed on the fourth surface 306, such that in the differential regions, the two traces are coupled through the PCBs by their fields.

The two PCBs may be affixed to each other using any method known in the art including, but not limited to, adhesive, mechanical fasteners (that would not interfere with the trace fields), thermal bonding, and the like. In some embodiments, one or more additional layers may be placed between the two PCBs to increase mechanical strength and/or enhance the bonding between the two substrates.

The ground plane 216 is sandwiched between the first PCB 104 and the second PCB 106. As shown, in some embodiments, the ground plane 216 may span the entirety of the decoupled region 204 and the grounded differential region 202. In other embodiments, it may be smaller than those regions, though it is still present between the two traces through the decoupled and grounded differential regions. In some embodiments, the two PCBs may be sealed along the edges (e.g. the ground plane would not be visible in FIG. 3), while in others it may be exposed.

The thickness of the PCBs has an impact on the dimensions of the traces, since it plays a large roll in the smallest separation possible for the traces on opposite sides of the layered probe substrate 102. In some embodiments, the PCB's may have a thickness of 8 mils. In other embodiments, the PCB's may be 12 mils thick, or thicker. The desired properties, such as differential impedance, will dictate the most appropriate PCB thickness, once mechanical strength is not a concern.

As shown, in some embodiments, a probe tip 116, such as the first probe tip 118 or the second probe tip 120, can be positioned such that it forms an angle 308, 310 with the probe substrate 102 (e.g. the first tip 118 forming a first angle 308 with respect to the first surface 300, the second tip 120 forming a second angle 310 with respect to the fourth surface 306, etc.). According to various embodiments, these angles may range between 0° and 90°. In some embodiments, they may be limited to between 10° and 90°. Orienting the probe tips 116 in such a way allows for easier access to the testing surface or device being investigated with the testing probe 100.

In some embodiments, these angles may be fixed at the time of manufacture, while in other embodiments these angles may be configured to be adjustable. For example, in some embodiments, the probe tips 116 may be coupled to the probe substrate 102 through conductive couplings configured to receive a probe tip 116 in a portion of the conductive coupling configured to pivot or turn about at least one axis while maintaining electronic communication between the tip 116 and its trace 107. The ability to adjust the orientation of one or more probe tips 116 would facilitate the testing of components having various widths between measurement contact points.

In some embodiments, the probe tips 116 may be angled with respect to each other. In other embodiments, the tips 116 may be angled with respect to a surface of the probe substrate 102. In still other embodiments, the probe tips 116 may be angled with respect to each other and the probe substrate 102. In some embodiments, these angles may be uniform (e.g. all tips 116 are at the same non-zero angle with respect to the substrate 102, etc.) across the tips, while in other embodiments the angles may vary from tip to tip. Similar to the first 308 and second 310 angles discussed above, in some embodiments the third angle 214 (and it's equivalents in embodiments having more than two probe tips 116) may be fixed at the time of manufacture, while in other embodiments it/they may be adjustable after manufacture.

Figure 4:
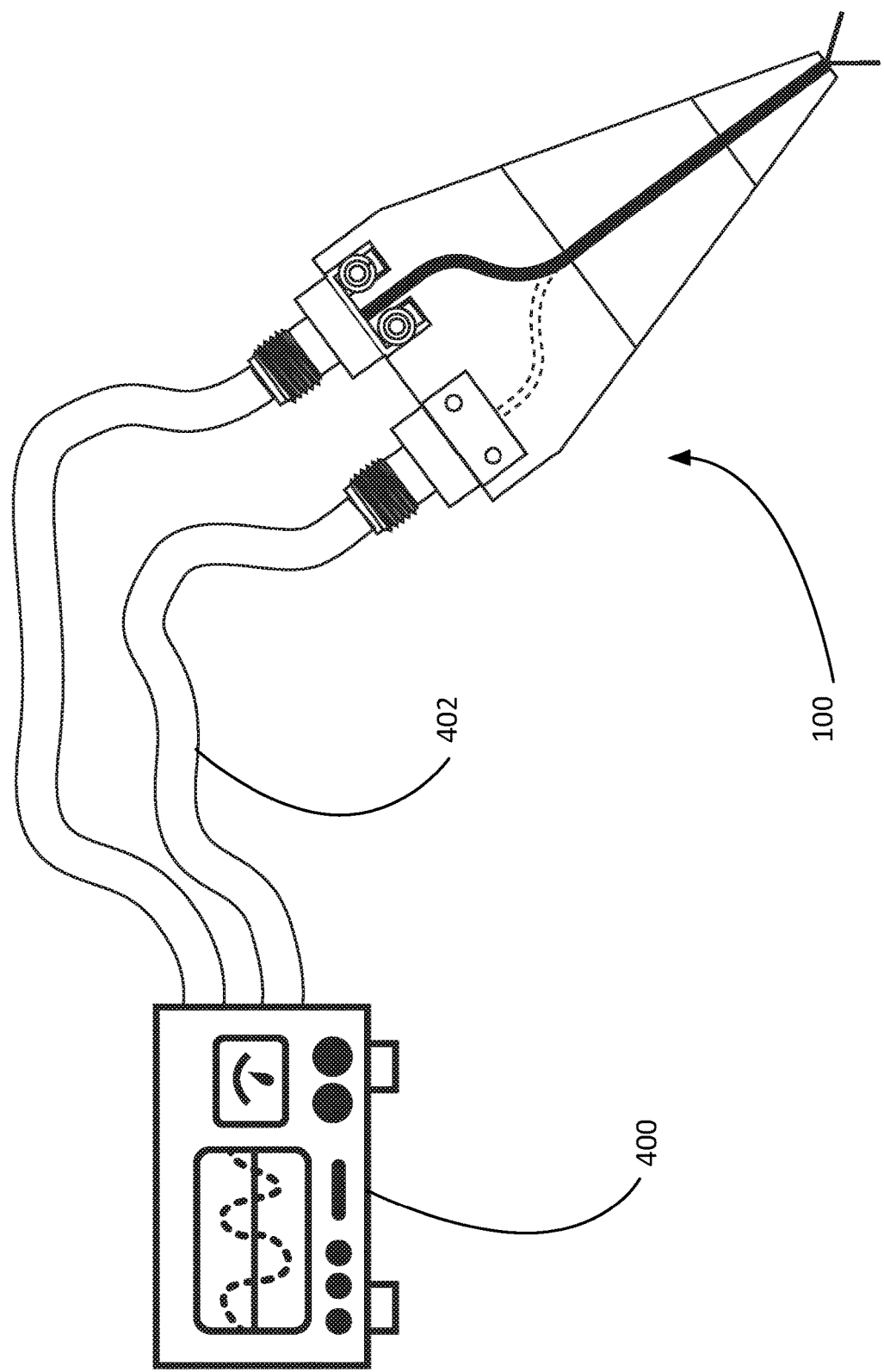
FIG. 4 is a system view of a high frequency layered testing probe and a testing device.

FIG. 4 is a system view of a non-limiting example of a high-frequency testing probe 100 coupled to a testing device 400 through a high-frequency cable 402. According to various embodiments, the testing probe 100 may be used in conjunction with a high frequency testing device, such as a vector network analyzer (VNA), a time domain reflectometer (TDR), a bit error rate tester (BERT), or other measurement equipment. As shown, the testing probe 100 may be coupled to the testing device 402 through one or more high-frequency cables 402 compatible with the probe connectors 126 of the probe 100.

Figure 5:
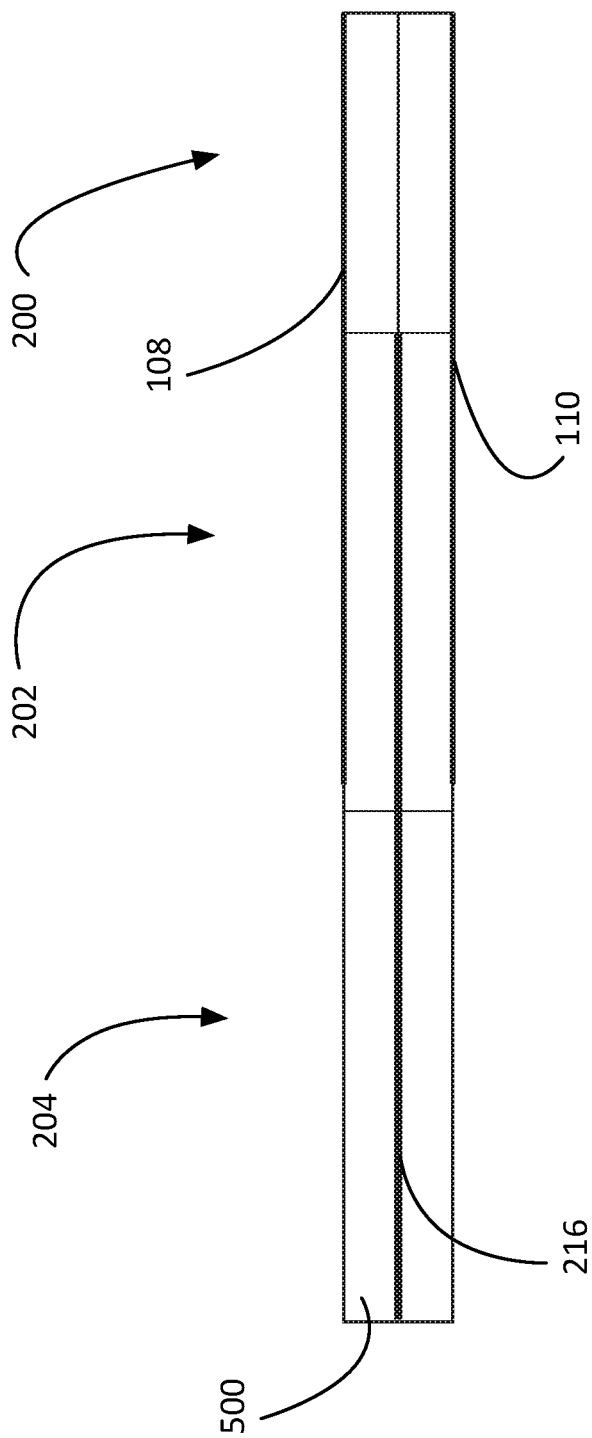
FIG. 5 is a cross-sectional view of the high frequency layered testing probe of FIG. 2 taken along line A-A.

FIG. 5 is a cross-sectional view of the high frequency layered testing probe of FIG. 2 taken along line A-A. According to various embodiments, the printed circuit board substrate may comprise materials suitable for high-frequency applications, including but not limited to hydrocarbon ceramic laminates, polytetrafluoroethylene (PTFE) 500, ceramic-filled PTFE, or other materials known in the art to be compatible with high-frequency signals. In one specific embodiment, a printed circuit board layer may be RO4003, and may be 8 mils thick.

The presence or absence of the ground plane 216 can cause a mode transition in the probe 100. For example, according to various embodiments, the probe tips 116, lacking a ground plane 216 between them, operate in an odd mode. The odd mode continues within the ungrounded differential region 200, until the ground plane 216 begins. Moving from the ungrounded differential region 200 to the grounded differential region 202 can cause a dramatic shift to operating in an even mode, which is maintained into the decoupled region 204 where the traces 107 separate to become isolated lines by the time the probe connectors 126 are reached.

Performing this transition from odd to even mode within the probe substrate 102 is advantageous, as it makes it possible to compensate for the abrupt change. However, the inclusion of an odd transmission mode has created difficulties in the development of the layered testing probe 100. Most conventional testing equipment is only able to simulate odd modes, extrapolating from single ended line measurements and hoping the assumption that the system is nicely behaved holds true. Actual odd mode measurement devices are still rare, complicating efforts to verify the efficacy of the probes contemplated herein. However, with difficulty, true odd mode measurements were made using two sources, and the performance of the probes 100 was verified to be superior to conventional probes, while being much easier to tune and manufacture.

Figure 6:
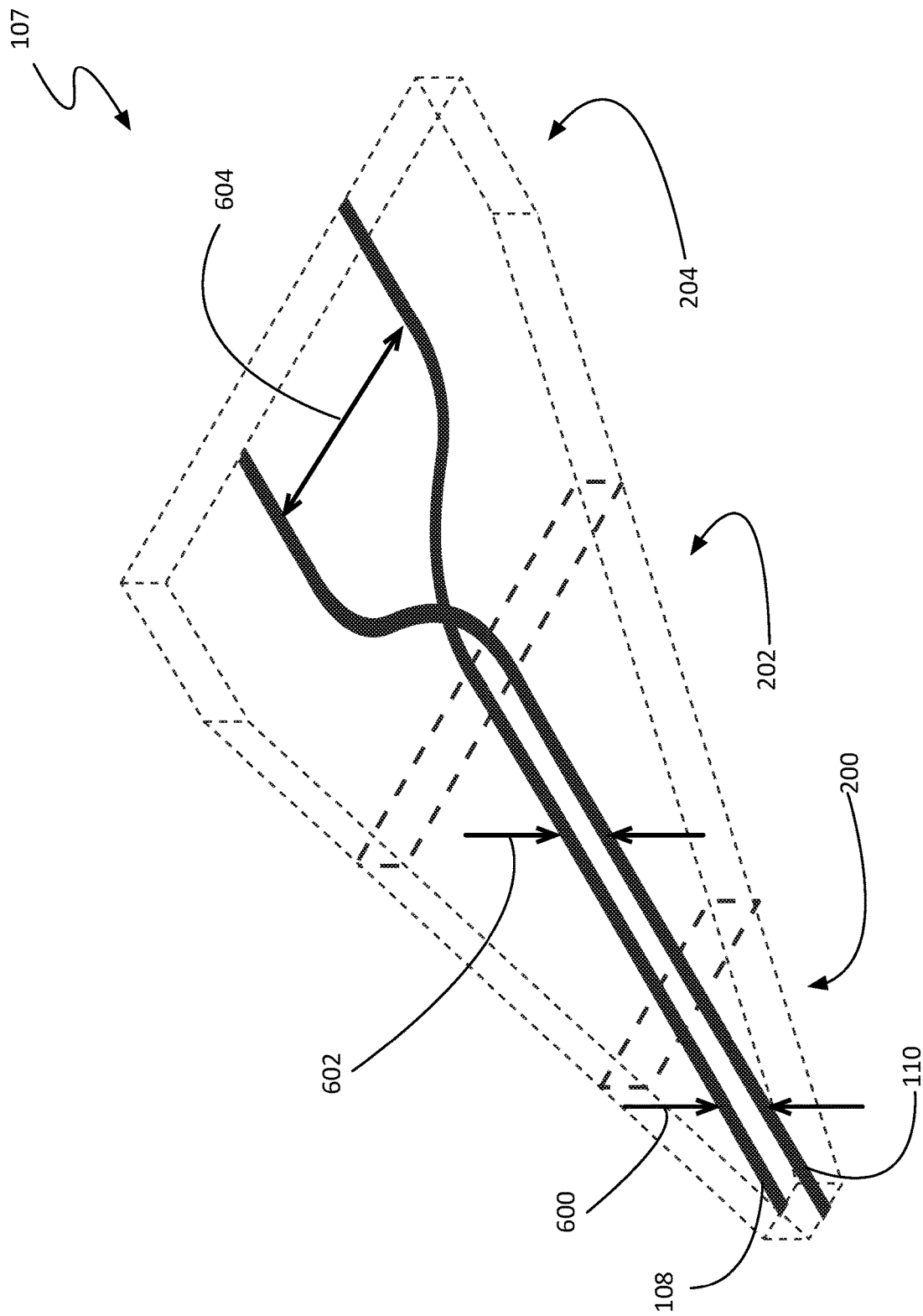
FIG. 6 is a perspective view of the conducting traces of high frequency layered testing probe.

FIG. 6 is a perspective view of the conducting traces of high frequency layered testing probe, with the probe substrate 102 made transparent so both traces 107 are visible. The distance between the two traces has a large impact on the properties of the probe 100, such as a the impedance, and the needed width for various segments of the traces.

As shown, in the ungrounded differential region 200, the first conducting trace 108 and the second conducting trace 110 are separated by a first distance 600. In many embodiments, this distance is substantially equal to the thickness of the probe substrate 102.

In the grounded differential region 202, the two traces 107 are separated by a second distance 602, on average. Within this region, the traces 107 act as a differential transmission pair (the second differential transmission pair 220), but are also transitioning between the first differential transmission pair 218 of the ungrounded differential region 200 and the decoupled region 204.

In the decoupled region 204, the two traces 107 are separated by at least a third distance 604. In some embodiments, the first, second, and third distances are all different. In other embodiments, the second distance 602 is between the first distance 600 and the third distance 604. In other embodiments, other modification may be used in place of, or along side of, changes in distance, to manipulate the impedance and other properties. These modifications may include, but are not limited to, changes in trace thickness, and changes in the dielectric constant of the substrate 102 between the traces 107.

In some embodiments, the layered testing probe 100 may be enclosed, at least partially, in a housing. The probe housing may help protect sensitive probe components from damage or interference that could compromise the probe's performance as a testing instrument. According to various embodiments, the housing may comprise a lossy material, such as acrylonitrile butadiene styrene (ABS) or polyvinyl chloride (PVC). The housing may further be internally coated with iron loaded silicone, ferrite loaded silicone, carbon loaded foam, or other similar materials suitable for shielding from radiated energy. According to various embodiments, the housing encloses at least a majority of the probe substrate 102, to provide protection for the sensitive traces 107 and other components. In some embodiments, the entire probe substrate 102 may be enclosed within the housing 500.

The probe housing may be formed with a variety of shapes, depending upon the desired application. Embodiments designed to be used manually by and individual may be shaped to facilitate their grip and permitting fine control over the positioning of the probe tips 116. Embodiments designed for use in an automated setting, or on components too small to consistently measure manually may comprise a receiver or similar structure configured to permit the testing probe 100 to be mounted on another structure or device during use.

Figure 7:
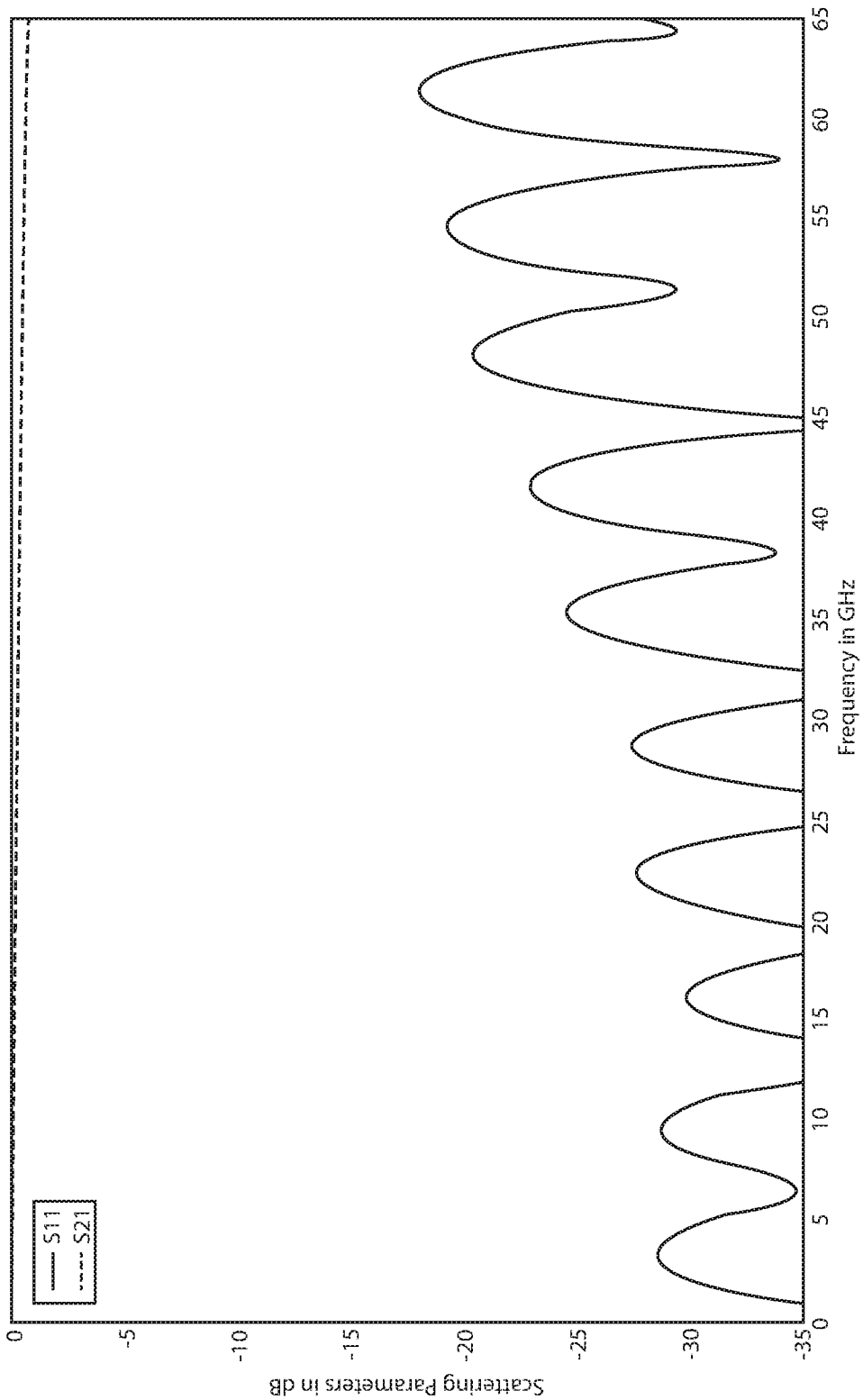
FIG. 7 is a plot of exemplary scattering parameters for high frequency layered testing probe.

FIG. 7 shows exemplary performance (i.e. scattering parameters) of a non-limiting example of a layered testing probe. These measurements demonstrate the probe expanding the range of frequencies over which the probe reliably measures when compared with traditional cable probes; in this instance, a range up to 65 GHz. Greater frequencies still may be measured with probes embodying the full teachings of this disclosure.

Where the above examples, embodiments and implementations reference examples, it should be understood by those of ordinary skill in the art that other testing probes and manufacturing methods and examples could be intermixed or substituted with those provided. In places where the description above refers to particular embodiments of a high frequency layered testing probe and manufacturing methods, it should be readily apparent that a number of modifications may be made without departing from the spirit thereof and that these embodiments and implementations may be applied to other to testing probes as well. Accordingly, the disclosed subject matter is intended to embrace all such alterations, modifications and variations that fall within the spirit and scope of the disclosure and the knowledge of one of ordinary skill in the art.

What is claimed is:

1. A high-frequency testing probe, comprising:
   a probe substrate that is layered and comprises:
   a first printed circuit board (PCB) having a first surface and a second surface opposite the first surface;
   a second PCB having a third surface and a fourth surface opposite the third surface, the third surface being affixed to the second surface of the first PCB;
   a first conducting trace disposed upon the first surface of the first PCB;
   a second conducting trace disposed upon the fourth surface of the second PCB;
   an ungrounded differential region, wherein inside the ungrounded differential region the first conducting trace is separated from the second conducting trace by a first distance, the first conducting trace coupled to the second conducting trace through the first and second PCBs forming a first differential transmission pair having a target differential impedance within the ungrounded differential region, the first conducting trace and the second conducting trace overlapping throughout the ungrounded differential region, the first and second conducting traces having a first width in the ungrounded differential region;
   a decoupled region distal to the ungrounded differential region and comprising a plurality of probe connectors disposed upon the probe substrate, the plurality of probe connectors comprising a first probe connector coupled to the first conducting trace and a second probe connector coupled to the second conducting trace, wherein inside the decoupled region the first conducting trace is separated from the second conducting trace by at least a third distance, the first and second conducting traces having a third width in the decoupled region;
   a grounded differential region comprising the probe substrate between the decoupled region and the ungrounded differential region, wherein inside the grounded differential region the first conducting trace is separated from the second conducting trace on average by a second distance, the first conducting trace coupled to the second conducting trace through the first and second PCBs forming a second differential transmission pair having the target differential impedance within the grounded differential region, the first and second conducting traces having a second width in the grounded differential region; and
   a ground plane that is conductive and sandwiched between the first PCB and the second PCB, between the first and second conducting traces and existing only in the decoupled region and the grounded differential region;
   at least two probe tips directly coupled to and extending outward from the ungrounded differential region of the probe substrate, each probe tip having a first end and a second end, the at least two probe tips comprising:
   a first probe tip communicatively coupled to the first probe connector through the first conducting trace disposed upon the first surface of the first PCB, the first conducting trace being electrically isolated and communicatively coupling the first probe tip only to the first probe connector, the first probe tip coupled to the first PCB at a first angle with respect to the first surface of the first PCB between 10° and 90°;
   a second probe tip communicatively coupled to the second probe connector through the second conducting trace disposed upon the fourth surface of the second PCB, the second conducting trace being electrically isolated and communicatively coupling the second probe tip only to the second probe connector, the second probe tip coupled to the second PCB at a second angle with respect to the fourth surface of the second PCB between 10° and 90°;
   wherein the first, second, and third distances are all different; and
   wherein the plurality of probe connectors are configured to couple the high-frequency testing probe to at least one of a high-frequency vector network analyzer and a high-frequency time domain reflectometer.

2. The high-frequency testing probe of claim 1, wherein the first conducting trace and the second conducting trace are each a third width in the decoupled region, a second width in the grounded differential region, and a first width in the ungrounded differential region, and wherein the first width is greater than the second width and less than the third width.

3. The high-frequency testing probe of claim 1, wherein the first probe tip is coupled to the first PCB at a third angle with respect to the second probe tip between 0° and 90°.

4. The high-frequency testing probe of claim 1, wherein the at least two probe tips comprises at least three probe tips.

5. The high-frequency testing probe of claim 1, wherein both the first PCB and the second PCB comprise polytetrafluoroethylene (PTFE).

6. A high-frequency testing probe, comprising:
   a probe substrate that is layered and comprises:
   a first printed circuit board (PCB) having a first surface and a second surface opposite the first surface;
   a second PCB having a third surface and a fourth surface opposite the third surface, the third surface being affixed to the second surface of the first PCB;
   a first conducting trace disposed upon the first surface of the first PCB;
   a second conducting trace disposed upon the fourth surface of the second PCB;
   an ungrounded differential region, wherein inside the ungrounded differential region the first conducting trace is separated from the second conducting trace by a first distance, the first conducting trace coupled to the second conducting trace through the first and second PCBs forming a first differential transmission pair having a target differential impedance within the ungrounded differential region, the first and second conducting traces having a first width in the ungrounded differential region;
   a decoupled region distal to the ungrounded differential region and comprising a plurality of probe connectors disposed upon the probe substrate, the plurality of probe connectors comprising a first probe connector coupled to the first conducting trace and a second probe connector coupled to the second conducting trace, wherein inside the decoupled region the first conducting trace is separated from the second conducting trace by at least a third distance, the first and second conducting traces having a third width in the decoupled region;

a grounded differential region comprising the probe substrate between the decoupled region and the ungrounded differential region, wherein inside the grounded differential region the first conducting trace is separated from the second conducting trace on average by a second distance, the first conducting trace coupled to the second conducting trace through the first and second PCBs forming a second differential transmission pair having the target differential impedance within the grounded differential region, the first and second conducting traces having a second width in the grounded differential region; and a ground plane that is conductive and sandwiched between the first PCB and the second PCB, between the first and second conducting traces and existing only in the decoupled region and the grounded differential region;

at least two probe tips directly coupled to and extending outward from the ungrounded differential region of the probe substrate, each probe tip having a first end and a second end, the at least two probe tips comprising:

a first probe tip communicatively coupled to the first probe connector through the first conducting trace disposed upon the first surface of the first PCB, the first conducting trace being electrically isolated and communicatively coupling the first probe tip only to the first probe connector;

a second probe tip communicatively coupled to the second probe connector through the second conducting trace disposed upon the fourth surface of the second PCB, the second conducting trace being electrically isolated and communicatively coupling the second probe tip only to the second probe connector;

wherein the plurality of probe connectors are configured to couple the high-frequency testing probe to at least one of a high-frequency vector network analyzer and a high-frequency time domain reflectometer.

7. The high-frequency testing probe of claim 6, wherein the first width is greater than the second width and less than the third width.

8. The high-frequency testing probe of claim 6, wherein the third distance is greater than the second distance, and the second distance is greater than the first distance.

9. The high-frequency testing probe of claim 6, wherein the first probe tip is coupled to the first PCB at a third angle with respect to the second probe tip between 0° and 90°.

10. The high-frequency testing probe of claim 6, wherein both the first PCB and the second PCB comprise polytetrafluoroethylene (PTFE).

11. The high-frequency testing probe of claim 6, wherein the first conducting trace and the second conducting trace overlap throughout the ungrounded differential region.

12. The high-frequency testing probe of claim 6, wherein the first probe tip is coupled to the first PCB at a first angle with respect to the first surface of the first PCB between 10° and 90°, and the second probe tip is coupled to the second PCB at a second angle with respect to the fourth surface of the second PCB between 10° and 90°.

13. A high-frequency testing probe, comprising:
a probe substrate that is layered and comprises:
a first printed circuit board (PCB) having a first surface and a second surface opposite the first surface;
a second PCB having a third surface and a fourth surface opposite the third surface, the third surface being affixed to the second surface of the first PCB;
a first conducting trace disposed upon the first surface of the first PCB;
a second conducting trace disposed upon the fourth surface of the second PCB;
an ungrounded differential region, wherein inside the ungrounded differential region the first conducting trace is separated from the second conducting trace by a first distance, the first conducting trace coupled to the second conducting trace through the first and second PCBs forming a first differential transmission pair having a target differential impedance within the ungrounded differential region;
a decoupled region distal to the ungrounded differential region and comprising a plurality of probe connectors disposed upon the probe substrate, the plurality of probe connectors comprising a first probe connector coupled to the first conducting trace and a second probe connector coupled to the second conducting trace, wherein inside the decoupled region the first conducting trace is separated from the second conducting trace by at least a third distance;
a grounded differential region comprising the probe substrate between the decoupled region and the ungrounded differential region, wherein inside the grounded differential region the first conducting trace is separated from the second conducting trace on average by a second distance, the first conducting trace coupled to the second conducting trace through the first and second PCBs forming a second differential transmission pair having the target differential impedance within the grounded differential region; and
a ground plane that is conductive and sandwiched between the first PCB and the second PCB, between the first and second conducting traces and existing only in the decoupled region and the grounded differential region;
wherein the plurality of probe connectors are configured to couple the high-frequency testing probe to at least one of a high-frequency vector network analyzer and a high-frequency time domain reflectometer.

14. The high-frequency testing probe of claim 13, further comprising:
at least two probe tips directly coupled to and extending outward from the ungrounded differential region of the probe substrate, each probe tip having a first end and a second end, the at least two probe tips comprising:
a first probe tip communicatively coupled to the first probe connector through the first conducting trace disposed upon the first surface of the first PCB, the first conducting trace being electrically isolated and communicatively coupling the first probe tip only to the first probe connector;
a second probe tip communicatively coupled to the second probe connector through the second conducting trace disposed upon the fourth surface of the second PCB, the second conducting trace being electrically isolated and communicatively coupling the second probe tip only to the second probe connector.

15. The high-frequency testing probe of claim 14, wherein the first probe tip is coupled to the first PCB at a first angle with respect to the first surface of the first PCB between 10° and 90°.

16. The high-frequency testing probe of claim 14, wherein the first probe tip is coupled to the first PCB at a third angle with respect to the second probe tip between 0° and 90°.

17. The high-frequency testing probe of claim 13, wherein the first conducting trace and the second conducting trace are each a third width in the decoupled region, a second width in the grounded differential region, and a first width in the ungrounded differential region, and wherein the first, second, and third widths are all different.

18. The high-frequency testing probe of claim 13, wherein the third distance is greater than the second distance, and the second distance is greater than the first distance.

19. The high-frequency testing probe of claim 13, wherein both the first PCB and the second PCB comprise polytetrafluoroethylene (PTFE).

20. The high-frequency testing probe of claim 13, wherein the first conducting trace and the second conducting trace overlap throughout the ungrounded differential region.

* * * * *